United States Patent [19]

Khoo et al.

[11] Patent Number: 5,508,872
[45] Date of Patent: Apr. 16, 1996

[54] CIRCUIT FOR GROUND FAULT DETECTION AND SWITCHING

[75] Inventors: Choon F. Khoo, Auburn Hills; Bor-Dong Chen, Dearborn; Viren B. Merchant, Canton; Aaron R. Tweadey, Farmington Hills, all of Mich.

[73] Assignee: Ford Motor Company, Dearborn, Mich.

[21] Appl. No.: 185,082

[22] Filed: Jan. 24, 1994

[51] Int. Cl.$^6$ ........................................... H02H 9/00
[52] U.S. Cl. .................. 361/42; 361/49; 361/56; 361/88
[58] Field of Search .................. 361/42, 49, 88, 361/91, 56, 18

[56] References Cited

U.S. PATENT DOCUMENTS

| | | | |
|---|---|---|---|
| 3,696,367 | 10/1972 | Inamdar | 340/255 |
| 3,786,466 | 1/1974 | Naito et al. | 340/255 |
| 3,801,898 | 4/1974 | Young | 324/51 |
| 4,661,879 | 4/1987 | Sato et al. | 361/58 |
| 4,725,912 | 2/1988 | Wrathall | 361/18 |
| 5,166,852 | 11/1992 | Sano | 361/42 |

*Primary Examiner*—A. D. Pellinen
*Assistant Examiner*—Sally C. Medley
*Attorney, Agent, or Firm*—Richard D. Dixon; Roger L. May

[57] ABSTRACT

A circuit for sensing the loss of a signal ground in an automotive electronic system having a source of electrical power and both a signal ground and a power ground, includes a first sensor coupled to the power ground and between the signal ground and the source of electrical power for generating a first signal responsive to the voltage on the signal ground differing from the voltage on the power ground by more than a first predetermined limit. A latching semiconductor switch is coupled to the first sensor and between the signal ground and the power ground for latching the electrical coupling of the signal ground to the power ground responsive to receiving the first signal.

7 Claims, 1 Drawing Sheet

CIRCUIT FOR GROUND FAULT DETECTION AND SWITCHING

BACKGROUND OF THE INVENTION

1. Field of the Invention

The present invention relates to sensing the loss of a signal ground, in an electronic system including both signal and power grounds, and the coupling of signal ground to power ground responsive thereto.

2. Description of the Prior Art

In automotive and military applications, it is common to have both power and signal grounds in order to isolate significant switching transients in the power system from interfering with the small voltages normally present on the digital signal circuits. For example, different wiring paths and circuits, including ground returns, are used for systems having relatively large power requirements, such as starter motors, power windows and air conditioning systems, as compared to systems employing small signal sensors, controllers and minor transducers, such as fuel level sensors, temperature sensors, engine control electronics, etc.

However, when two different ground returns are provided, it is possible in harsh environments, such as automotive systems, that either the signal or the power grounds can be lost due to a broken wire, a loose connector or a corroded interconnect. When one ground is lost or becomes intermittent, ground loops and bias offset voltages may be induced in sensor and small signal controllers which disrupt the operation or reduce the accuracy of these important systems.

The present invention senses the loss of the signal ground and then substitutes the power ground for the signal ground until the power is reset or, if the problem persists, until the source of the problem can be corrected. Since the battery voltage can drop to as low as 5.5 volts during cold cranking conditions and can be as high as 24 volts during jump starting conditions, the circuitry for controlling the ground system switching must be capable of operating over the entire range of 5.5 to 24 volts.

It is therefore an object of the present invention to sense any interruption in the signal ground used by the power and electronics systems of an automotive vehicle, and to switch and to latch the signal ground to the power ground when the signal ground is interrupted.

SUMMARY OF THE INVENTION

The present invention relates to a circuit for sensing the loss of a signal ground in an automotive electronic system having a source of electrical power and both a signal ground and a power ground. First sensing means are coupled to the power ground and between the signal ground and the source of electrical power for generating a first signal responsive to the voltage on the signal ground exceeding the voltage on the power ground by more than a first predetermined limit. Latching means, coupled to the first sensing means and between the signal ground and the power ground, are provided for latching the electrical coupling of the signal ground to the power ground responsive to receiving the first signal. In the first preferred embodiment, the first sensing means comprises an FET transistor, and the latching means comprises an SCR.

BRIEF DESCRIPTION OF THE DRAWING

Other objects, features and advantages of the present invention will be apparent from studying the written description and the drawing in which.

DETAILED DESCRIPTION OF THE PREFERRED EMBODIMENT

Figure 1:
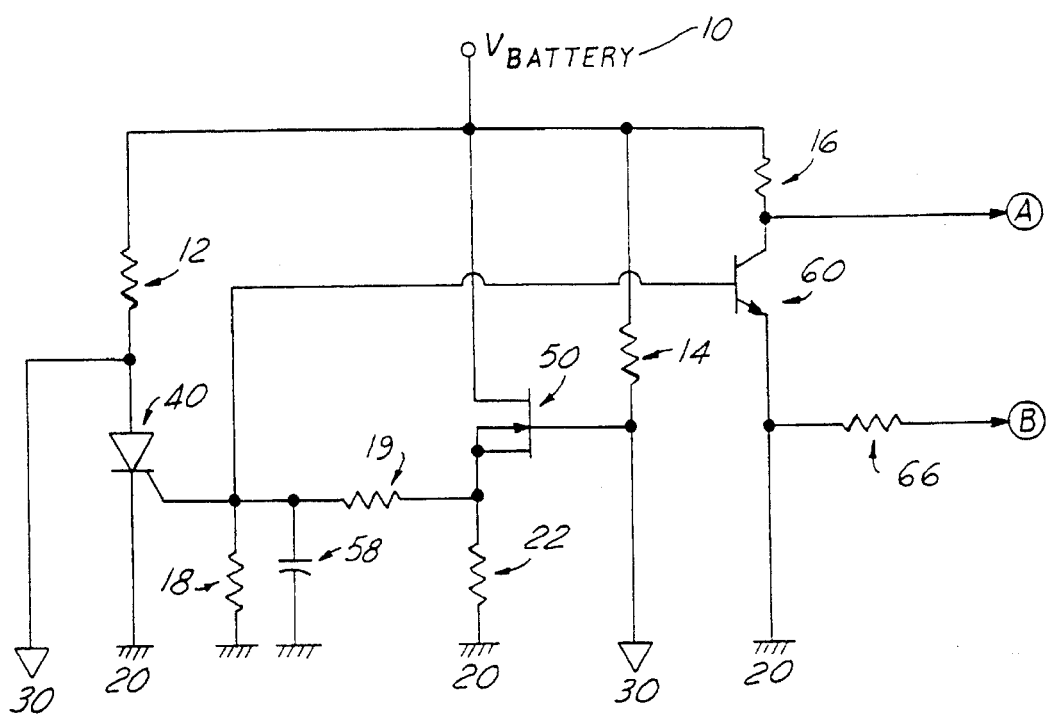
FIG. 1 illustrates a electrical circuit schematic of the first preferred embodiment of the present invention.

A circuit diagram of the first preferred embodiment of the present invention is illustrated in FIG. 1 as being coupled between a source of electrical power 10, such as a 12 volt lead acid storage battery used in an automotive vehicle, a power ground 20 and a small signal ground 30. The power ground 30 often utilizes structural sheet metal and the frame of the vehicle for a return path to the battery from the electrical loads, such as a motor. In contrast, the small signal ground normally comprises a dedicated copper conductor that circulates to all of the connected electronics modules through the wiring harness of the automotive vehicle.

The preferred embodiment of the circuit includes a Silicon Controlled Rectifier (SCR, typically an MCR 100-7) 40 that includes an anode coupled to the signal ground 30 and also through a current limiting resistor 12 (560 ohms) to the source of electrical power 10, and a cathode that is coupled to the power ground 20. A control gate of the SCR 40 is coupled through a series resistor 19 (5.6 k ohms) to the source of an N-channel FET transistor 50 (typically an IRFZ44) and then through a current limiting resistor 22 (10 k ohms) to the power ground 20. Resistors 18 and 19 form a resistive voltage divider for reducing the voltage and limiting the current flowing from the source of FET 50 to the gate of the SCR 40. A capacitor 58 (6.8 mr) is coupled from the gate of the SCR 40 to power ground 20 for reducing the sensitivity of the SCR 40 to noise spikes and switching voltage transients, especially power on transients. Resistor 18 (1 k ohm) functions to bleed off leakage current from the SCR 40 to prevent false triggering during normal operation. The SCR 40 operates as a switch and a latch for coupling the signal ground 30 to the power ground 20 in response to a positive signal voltage from an FET 50.

The FET 50 operates as a voltage sensor for triggering the SCR 40 when the power ground 20 becomes intermittent or is lost. The drain of the FET transistor 50 is coupled to the source of electrical power 10. The gate of the FET transistor 50 is coupled to the signal ground 30 and then through a current limiting resistor 14 (1 k ohm) to the source of electrical power 10.

A bipolar transistor 60 (typically a 2N4401) includes a collector that is coupled to an external node A and through a current limiting resistor 16 (10 k ohm) to the source of electrical energy 10. The emitter of transistor 60 is coupled to the power ground 20 and through a resistor 66 (100 k ohm) to a second external node B. The base of transistor 60 is coupled to the gate of SCR 40. Transistor 60 provides a signal at node A when the signal ground is lost, and a signal at node B when the power ground is lost.

The operation of the circuit illustrated in FIG. 1 will be based on the initial assumptions that the SCR 40, the FET 50 and the bipolar transistor 60 will be off and not conducting when both the power ground 20 and the signal ground 30 are connected. Under these conditions the gate of the FET 50 will be at signal ground 30 potential, which is typically 0 volts but could be as high as 1.0 volt above power ground 30 due to voltage differentials between the two ground systems. Due to the biasing of FET 50, the forward threshold voltage at the gate must exceed a threshold voltage of 1 volt before the FET 50 turns on and conducts. When the signal ground 30 is interrupted or completely lost, then the voltage at the gate of FET 50 will be pulled up suddenly, causing the gate to source threshold voltage for FET 50 to be exceeded, thereby causing FET 50 to conduct current through the series resistor 22. The voltage at the source of FET 50 rises and is transferred through the voltage divider comprising resistors 19 and 18 to increase the voltage at the gate of SCR 40 and thereby causing it to latch into a conducting mode. As a result of SCR 40 turning on, the signal ground 30 is coupled to the power ground 20 through the low impedance presented by the SCR 40. Because of the latching properties of the SCR 40, the signal ground 30 will be latched to the power ground 20 until the source of electrical energy is removed from the circuit, which typically occurs when the ignition switch of the automobile is turned off.

When FET 50 is turned on, then the higher voltage across resistor 18 also will cause transistor 60 Co turn on. This causes the voltage at node A to change from approximately the voltage of the source of electrical power 10 to approximately the potential of the power ground 20. This voltage drop at external node A provides a diagnostic signal to external diagnostic circuitry (not illustrated) that monitors the status of the signal generated by FET 50. The voltage at external node A can be used to activate a visual indicator to alert the driver about the loss of the signal ground. Resistor 16 serves as a pull-up resistor and limits the current to transistor 60.

When power ground 20 is intermittent or is lost, then the voltage at external node B is pulled up to approximately the voltage of the source of electrical power 10. This increase in the voltage at external node B can be used to activate a visual indicator for alerting the operator about the loss of power ground, which also can cause troublesome operating characteristics for the vehicle.

While the preferred embodiment of the present invention has been disclosed and described in detail, further modifications, enhancements and embodiments are contemplated to be within the spirit and scope of the present invention and the following claims.

We claim:

1. A circuit for sensing the loss of a signal ground in an automotive electronic system having a source of electrical power and both a signal ground and a power ground, comprising in combination:

first sensing means coupled to the power ground and between the signal ground and the source of electrical power for generating a first signal responsive to the voltage on the signal ground differing from the voltage on the power ground by more than a first predetermined limit; and latching means, coupled to said first sensing means and between the signal ground and the power ground, for electrically coupling the signal ground to the power ground responsive to receiving said first signal and thereafter even in the absence of said first signal.

2. The circuit in accordance with claim 1 wherein said latching means comprises switching diode means having an anode coupled to the signal ground and a cathode coupled to the power ground, said switching diode means further including a gate for forward biasing the cathode-anode junction responsive to receiving said first signal.

3. The circuit in accordance with claim 2 wherein said switching diode means comprises a silicon controlled rectifier.

4. The circuit in accordance with claim 2 wherein said first sensing means comprises:

a field effect transistor having a source coupled to the power ground, a drain coupled to the source of electrical power, and a gate for controlling the flow of current between said source and said drain, and pull up means for coupling and biasing said gate of said field effect transistor between the source of electrical power and the signal ground, and for supplying electrical power to said gate of said field effect transistor responsive to the voltage on the signal ground exceeding the voltage on the power ground by more than a first predetermined limit.

5. The circuit in accordance with claim 2 wherein said switching diode means comprises a signal controlled rectifier.

6. The circuit in accordance with claim 1 further including indicator driver means, coupled between the power ground and the source of electrical power and having an input coupled to said first sensing means, for generating a first failure signal responsive to receiving said first signal from said first sensing means and for generating a second failure signal responsive to the voltage on the power ground exceeding the voltage on the signal ground by more than a second predetermined level.

7. A circuit for sensing the loss of a signal ground in an automotive electronic system having a source of electrical power and separate signal ground and power ground systems, comprising in combination:

a field effect transistor having a source coupled to the power ground, a drain coupled to the source of electrical power, and a gate for controlling the flow of current between said source and drain, pull up means for coupling and biasing said gate of said field effect transistor between the source of electrical power and the signal ground, and for supplying a turn-on voltage to said gate of said field effect transistor responsive to the voltage on the signal ground differing from the voltage on said source of said field effect transistor by more than a first predetermined threshold voltage, whereby said field effect transistor conducts current and generates a first signal responsive thereto, and a silicon controlled rectifier having an anode coupled to the signal ground and a cathode coupled to the power ground, said silicon controlled rectifier further including a gate coupled to said field effect transistor for forward biasing and latching the cathode-anode junction responsive to initially receiving said first signal and thereafter even in the absence of said first signal, thereby electrically coupling the signal ground to the power ground responsive to the loss of the signal ground.

* * * * *